US009105304B2

(12) United States Patent
Marrow et al.

(10) Patent No.: US 9,105,304 B2
(45) Date of Patent: Aug. 11, 2015

(54) MARGINING DECODING UTILIZING SOFT-INPUTS

(71) Applicant: SK hynix memory solutions inc., San Jose, CA (US)

(72) Inventors: Marcus Marrow, San Jose, CA (US); Jason Bellorado, San Jose, CA (US); Yu Kou, San Jose, CA (US)

(73) Assignee: SK hynix memory solutions inc., San Jose, CA (US)

( * ) Notice: Subject to any disclaimer, the term of this patent is extended or adjusted under 35 U.S.C. 154(b) by 0 days.

(21) Appl. No.: 14/266,664

(22) Filed: Apr. 30, 2014

(65) Prior Publication Data

US 2014/0327981 A1    Nov. 6, 2014

Related U.S. Application Data

(63) Continuation of application No. 13/040,544, filed on Mar. 4, 2011, now Pat. No. 8,755,135.

(60) Provisional application No. 61/339,561, filed on Mar. 4, 2010.

(51) Int. Cl.
*G11B 27/36*    (2006.01)
*G11B 20/18*    (2006.01)
*H03M 13/00*    (2006.01)
*H03M 13/11*    (2006.01)

(52) U.S. Cl.
CPC ........ *G11B 20/1833* (2013.01); *G11B 20/1816* (2013.01); *G11B 20/1879* (2013.01); *H03M 13/612* (2013.01); *H03M 13/6337* (2013.01); *G11B 2020/185* (2013.01); *H03M 13/1111* (2013.01)

(58) Field of Classification Search
None
See application file for complete search history.

(56) References Cited

U.S. PATENT DOCUMENTS

| 6,069,856 | A  | * | 5/2000 | Mita et al. | 369/47.19 |
|---|---|---|---|---|---|
| 6,446,236 | B1 | * | 9/2002 | McEwen et al. | 714/795 |
| 6,507,927 | B1 | * | 1/2003 | Kalliojarvi | 714/795 |
| 7,849,379 | B2 | * | 12/2010 | Kang | 714/758 |
| 8,094,396 | B1 | * | 1/2012 | Zhang et al. | 360/31 |
| 8,194,338 | B1 | * | 6/2012 | Zhang | 360/31 |
| 8,209,583 | B2 | * | 6/2012 | Chiou | 714/755 |
| 8,489,971 | B1 | * | 7/2013 | Chan et al. | 714/795 |
| 2006/0195772 | A1 | * | 8/2006 | Graef et al. | 714/795 |
| 2007/0011586 | A1 | * | 1/2007 | Belogolovyi et al. | 714/774 |
| 2007/0279788 | A1 | * | 12/2007 | Andersen et al. | 360/53 |
| 2009/0235116 | A1 | * | 9/2009 | Tan et al. | 714/15 |
| 2009/0235146 | A1 | * | 9/2009 | Tan et al. | 714/780 |
| 2011/0075569 | A1 | * | 3/2011 | Marrow et al. | 370/242 |
| 2011/0188365 | A1 | * | 8/2011 | Maeto | 369/59.22 |

* cited by examiner

*Primary Examiner* — Dismery Mercedes
(74) *Attorney, Agent, or Firm* — Van Pelt, Yi & James LLP

(57) ABSTRACT

Determining a parameter associated with whether a portion of a storage device is defective is disclosed. Determining comprises: obtaining known data associated with the portion; reading back from the portion to produce a read-back waveform; decoding the read-back waveform, including producing statistical information; and determining a parameter associated with whether the portion is defective based at least in part on the statistical information.

15 Claims, 10 Drawing Sheets

MARGINING DECODING UTILIZING SOFT-INPUTS

CROSS REFERENCE TO OTHER APPLICATIONS

This application is a continuation of co-pending U.S. patent application Ser. No. 13/040,544, entitled MARGINING DECODING UTILIZING SOFT-INPUTS filed Mar. 4, 2011 which is incorporated herein by reference for all purposes, which claims priority to U.S. Provisional Patent Application No. 61/339,561 entitled MARGINING DECODING UTILIZING SOFT-INPUTS filed Mar. 4, 2010 which is incorporated herein by reference for all purposes.

BACKGROUND OF THE INVENTION

Most products undergo a process of qualification to ensure the quality of every shipped product. In doing so, the product is tested, often beyond its intended use, so as to ensure (with relatively high probability) that it will not fail in the field. Improved techniques for qualifying products would be useful.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In various embodiments, the techniques described herein are implemented in a variety of systems or forms. In some embodiments, the techniques are implemented in hardware as an application-specific integrated circuit (ASIC) or a field-programmable gate array (FPGA). In some embodiments, a processor (e.g., an embedded one such as an ARM core) is used where the processor is provided or loaded with instructions to perform the techniques described herein. In some embodiments, the technique is implemented as a computer program product that is embodied in a computer readable storage medium and comprises computer instructions.

Figure 1:
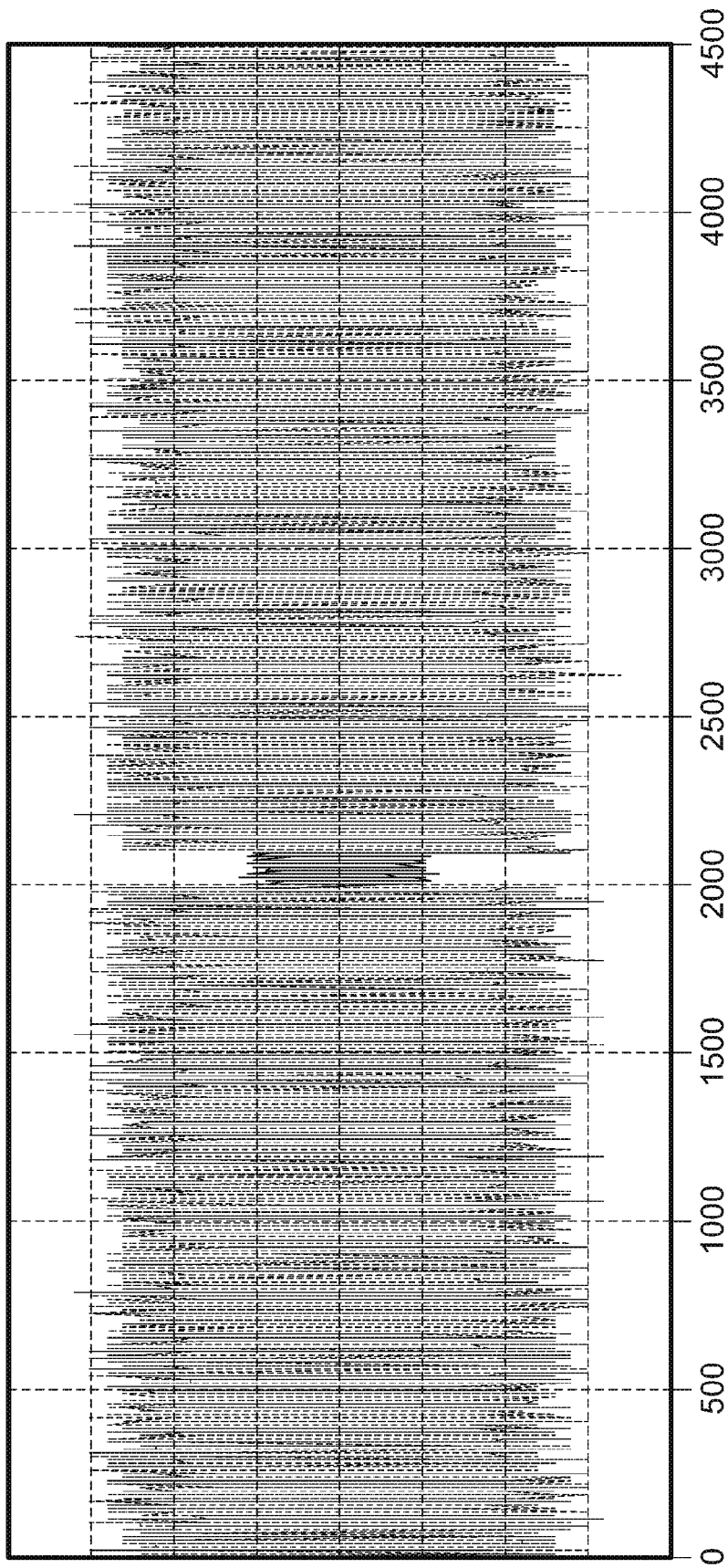
FIGS. 1 and 2 are diagrams illustrating examples of defects in a magnetic recording system.
Figure 2:
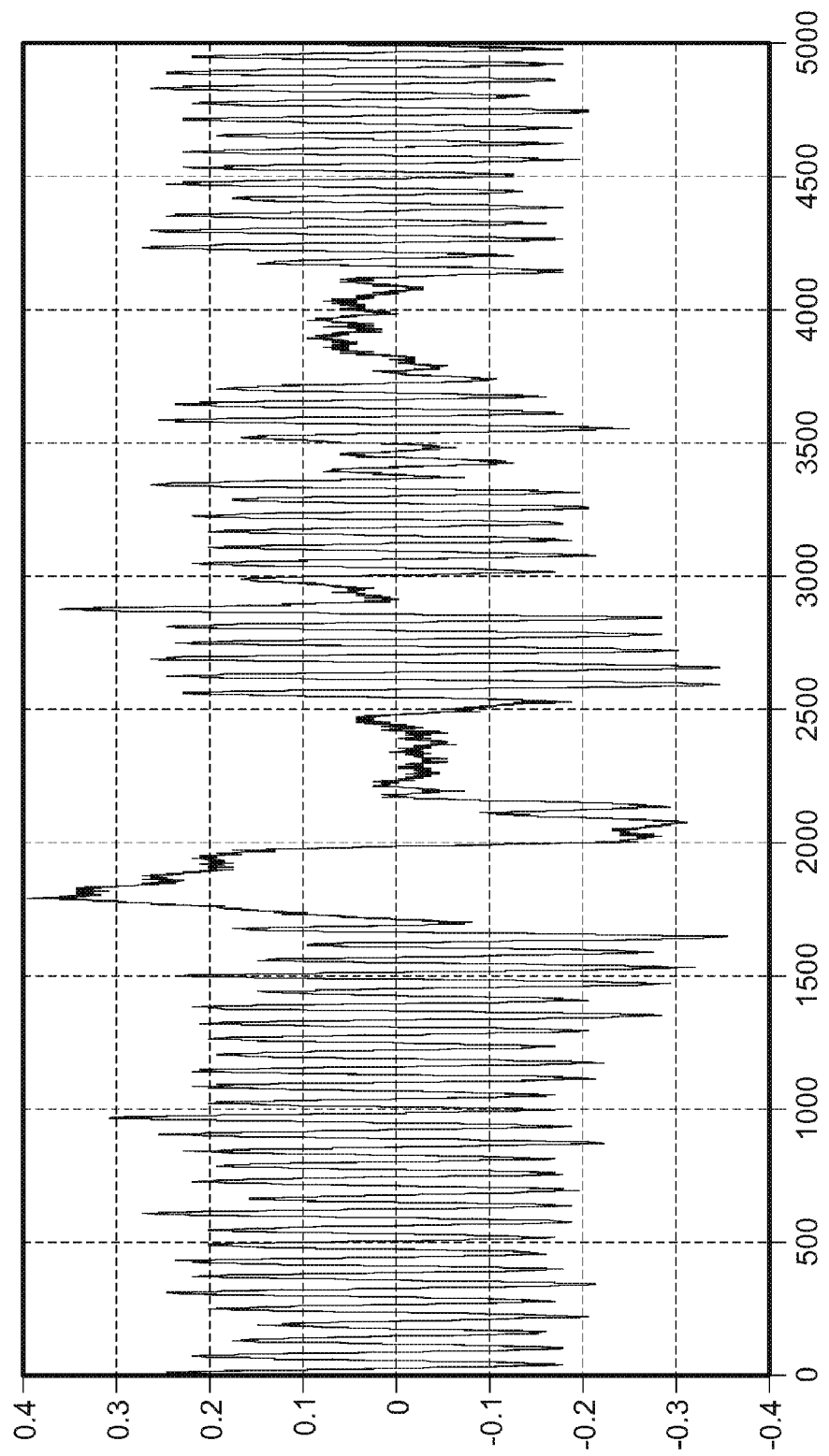

FIGS. 1 and 2 are diagrams illustrating examples of defects in a magnetic recording system.

In magnetic recording systems, every disk is first scanned for defects as part of the product qualification. If the disk (and the heads used to read and write) is of sufficient quality to support the intended capacity, then it can theoretically be shipped as a product.

Two types of defects are amplitude dropout and permanently polarized media. FIG. 1 shows an example of amplitude dropout, in which the amplitude is reduced over some portion of the disk. FIG. 2 shows an example of permanently polarized media, in which some portion(s) of the disk always read back the same value, i.e., are "permanently" polarized to some value.

Defects can grow in size and severity while the disk is in the field. Thus, a disk which was deemed of acceptable quality during manufacturing may degrade to unacceptable quality over time. To ensure that the disk remains of sufficient quality over the lifetime of the drive, drives must not just simply pass the qualification, but must do so with a degree of margin. It has, therefore, been a long-standing problem as to how to deem a disk as being of sufficient quality to sustain performance, even with the unavoidable degradation over time.

One method for determining the amount of error margin in the disk is based on the error correction scheme implemented. A hard disk drive (HDD) system generally adds redundancy to the encoded data, in the form of error correction, so as to recover from bit errors. One such error correction code is bounded distance decoding, which is capable of correcting up to n bit errors within a sector. The existing margin for a HDD using bounded distance decoding may be derived in whole or in part from the bounded distance of the code. In some (HDD) systems, instead of bounded distance decoding, codes associated with soft information, such as low-density paritycheck (LDPC) codes, are used. Although LDPC codes are more powerful than some other codes, they are not bounded distance decodable. For example, a sector with 100 bit errors may be easily decodable by an LDPC decoder, whereas another sector with 50 bit errors may not be decodable. For HDD systems using such codes, it can be difficult to determine when the decoder is close to failure (and, thus, difficult to determine the amount of existing margin).

In some hard disk drive (HDD) systems, margining of hard-disk drives (HDDs) is conducted based on properties of the error-correction code (ECC). In some HDD systems, bounded distance codes/decoders are employed that guarantee that a certain number of bits (or symbols) will be corrected by the decoder. This property of these codes/decoders is useful in margining HDDs. For example, if a code is utilized which can guarantee that a read-back waveform will be correctable if less than N bit errors occur, then a sector can be written and read-back and the number of bit errors can be counted. If more than L (L<N) bit errors have occurred, then it is known that at least (N−L) more bit errors can be tolerated before ECC failure. Thus, the smaller L is made, the larger amount of margin is obtained (i.e. we allow for (N−L) more bits to be in error before failure).

Figure 3:
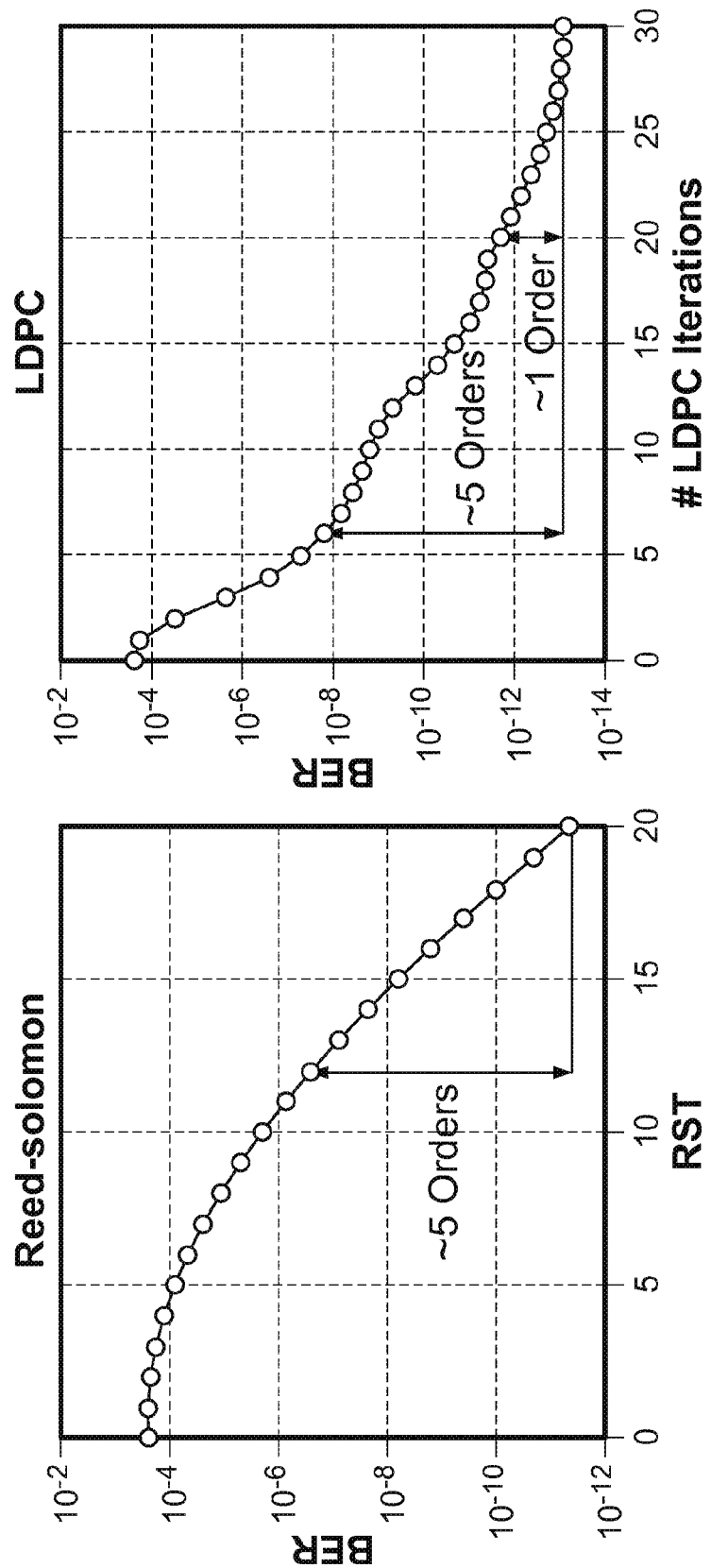
FIG. 3 is a diagram illustrating a comparison of performance between a bounded distance code (specifically, a Reed Solomon code) and for a code that utilizes soft or statistical information (specifically, an LDPC code).

FIG. 3 is a diagram illustrating a comparison of performance between a bounded distance code (specifically, a Reed Solomon code) and for a code that utilizes soft or statistical information (specifically, an LDPC code).

Reed-Solomon is an example of a bounded distance code. FIG. 3 shows an example in which the Reed-Solomon code can correct up to T errors at the bit error rates (BERs) shown. BER in this example is defined as sector failure rate/# user bits in a sector. If the disk drive is to be operated in the field at T=20, then when conducting margining, one may decide to pass only if fewer than 12 errors occur (leaving 20−12=8 bits of margin) or the BER is that corresponding to T=12. If it passes at the BER corresponding to T=12, then it is most likely going to pass at the BER corresponding to T=20 because there are approximately 5 orders of magnitude difference in BER, as shown in the plot.

FIG. 3 also shows a plot of number of decoding iterations versus bit error rate (BER). If the disk drive is to be operated in the field at # iterations=30, then when conducting margining, one may decide to set the passing criterion to be such that 20 iterations corrects all the errors. If it passes at the BER corresponding to # iterations=20, then it is hopefully will also pass at the BER corresponding to # iterations=30. However, in contrast, in the Reed Solomon example, there is only approximately 1 order of magnitude difference in BER, as shown in the plot. One would need to set the pass criterion at # iterations=6 in order to get ~5 orders of magnitude difference in BER. However, backing off to # iterations=6 may be too few iterations meaning too few sectors will pass. Therefore, for LDPC systems, it would be useful to have other techniques for margining.

Some people have proposed margining by reducing the number of iterations used by the LDPC decoder, which is a way of weakening the decoder's correction capability. The biggest problem with this is that it doesn't give the same type of granularity that backing off the RS-T gives you. In some instances, the BER at 0 iterations is 1e-4, and the BER at 1 iteration is 1e-10 (i.e., a sector failure is never observed). This is because the LDPC decoder is so powerful, that it can fix many (100's) of bit errors in only 1 (or a few) iterations. By contrast, the RS curve is very flat at the top, so changing the value of T by 1 gives a small increase in performance for low values of T. This makes it much easier to weaken the decoding power to observe failures.

Codes/coding schemes such as LDPC obtain good performance by utilizing statistical or soft-information as input to the decoder. As such, the channel detector does not just produce an estimate of the transmitted data (i.e., the written data bit=1), but provides a reliability with which it produces this estimate (i.e., the written data bit=1 with probability 0.95). This soft information is vital to achieving superior decoding performance. For example, suppose a decoder determines than one of two bits (bk1 and bk2) is in error. If the information is also provided that bk1=1 with probability 0.51, and bk2=0, with probability 0.99999, it is clear that (most likely) bk1 is in error and should be set to 0. If soft-information is not utilized (as is the case of a hard-input decoder) the only available information is bk1=1 and bk2=0, making the decision of which bit is in error impossible.

Figure 4:
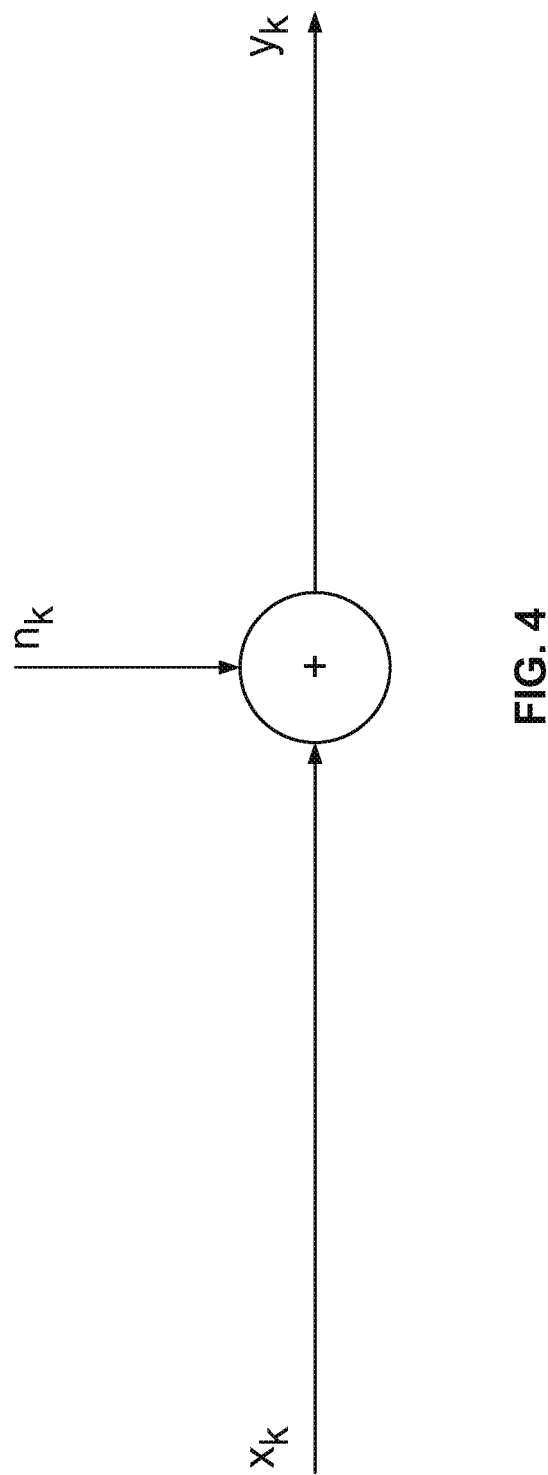
FIG. 4 shows an example of an Additive White Gaussian Noise (AWGN) channel model.
Figure 5:
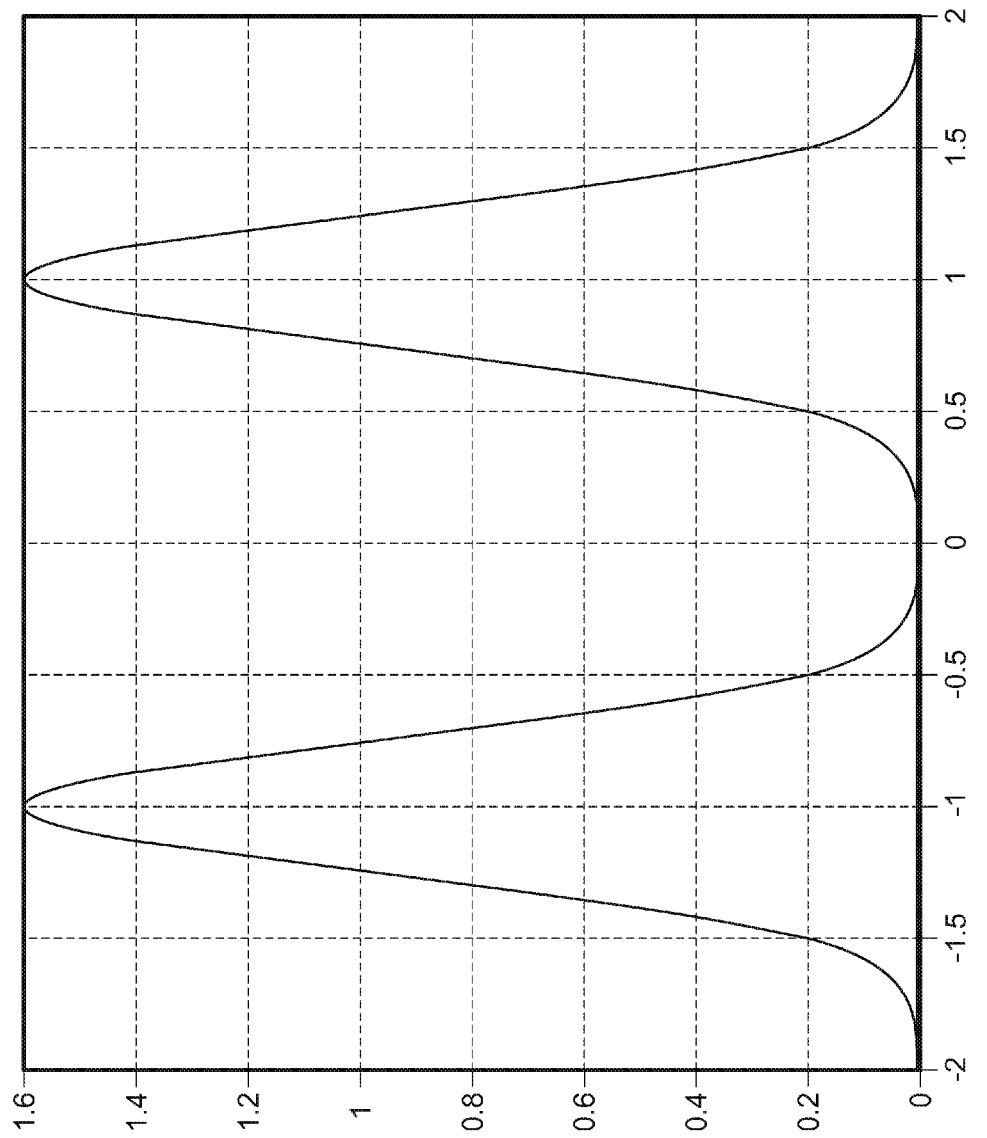
FIG. 5 shows an example of a probability density function of the AWGN channel output $y_k$ shown in FIG. 4.

The decoding operation is made much easier through use of soft-information. The difficulty, however, is that soft-information must be produced by assuming that the statistics of the channel are known. FIG. 4 shows an example of an Additive White Gaussian Noise (AWGN) channel model. In this example, a transmitted signal $x_k \in \{-1,1\}$ has a noise term $n_k$ added to it, which is a Gaussian random variable with mean 0 and standard deviation $\sigma$. Thus, the probability distribution of $y_k$ is a mixture of Gaussian probability density functions (PDFs). FIG. 5 shows an example of a probability density function of the AWGN channel output $y_k$ shown in FIG. 4. If we receive a value of $y_k$, then the likelihood functions can be formed using the Gaussian PDF function as $$\Pr(x_k=-1|y_k)=1/\sqrt{(2\sigma^2)}\exp((\tfrac{1}{2}\sigma^2)\cdot(y_k+1)^2) \quad (1)$$

$$\Pr(x_k=1|y_k)=1/\sqrt{(2\sigma^2)}\exp((\tfrac{1}{2}\sigma^2)\cdot(y_k-1)^2). \quad (2)$$

These probabilities are often expressed as a log-likelihood ratio, i.e., $$LLR_k=\log(\Pr(x_k=-1|y_k)/\Pr(x_k=+1|y_k)), \quad (3)$$

which, for the given example, is expressed as, $$LLR_k=1/\sqrt{(2\sigma^2)}\cdot((y_k+1)^2-(y_k-1)^2). \quad (4)$$

Thus, a positive LLR indicates that it is more likely that a −1 was transmitted, whereas a negative LLR indicates that is more likely that a +1 was transmitted.

The difficulty is when the channel (statistical) model (AWGN in the above example) does not match the assumed statistics. In the case of hard-disk drives, a channel model (more sophisticated than that of the AWGN channel model) is used to produce log-likelihood ratios. This channel model assumes certain properties about the signal and the noise, which are utilized to determine how likely writing a "0" or a "1" would be to produce a given read-back sample. In most cases, the assumptions hold and the produced soft-information is closely representative of the probabilities of a "0" and a "1" being written in a given location. This, however, is not the case during defects. In some embodiments, a defect refers to a location in the media where assumed statistics are not the actual statistics.

Figure 6:
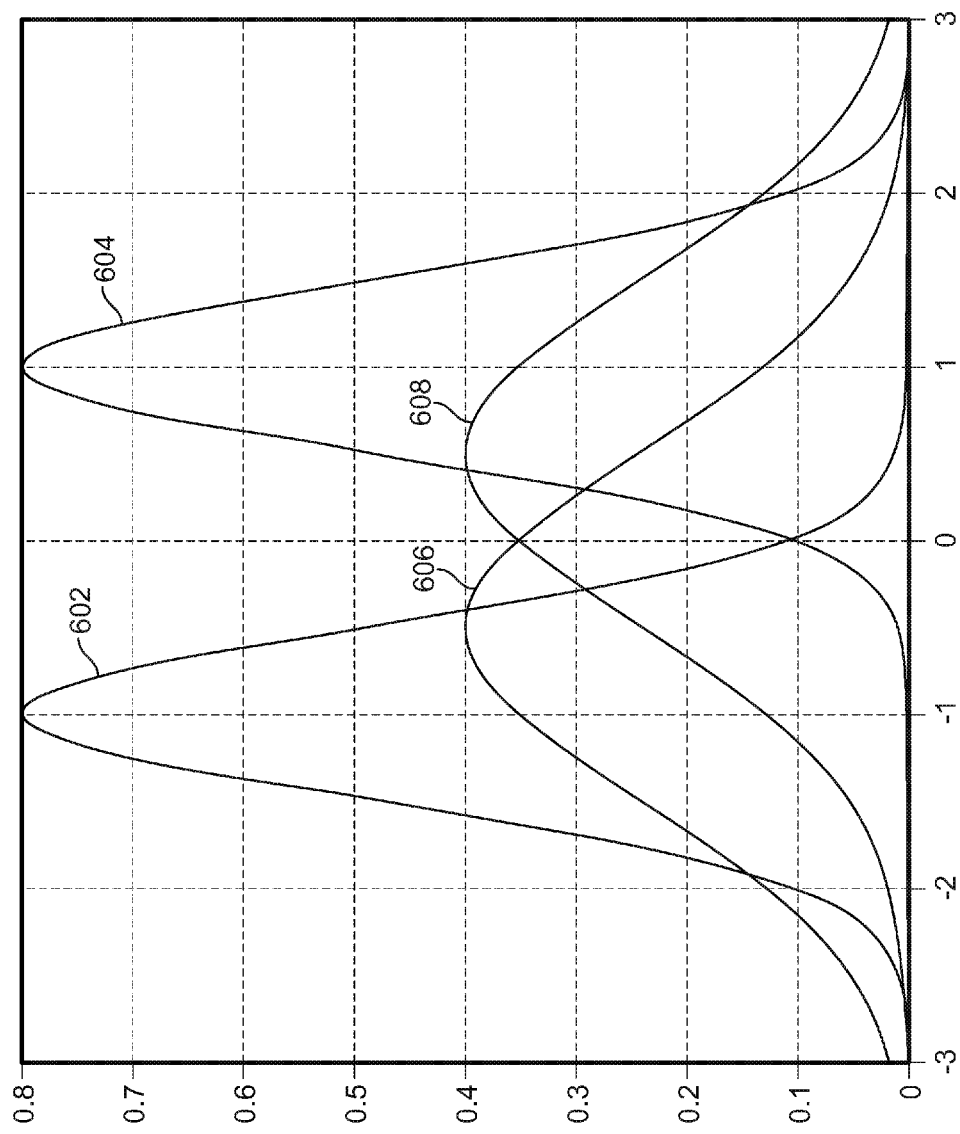
FIG. 6 shows an example of probability density functions inside a defect and outside a defect.

A defect is a property of the media in which there exist irregularities of the magnetic grains and their associated spacing. As such, waveforms read off defective portions of the media do not adhere to the statistical assumptions used to produce the soft-information. This means that the soft-information produced is not representative of the probability of writing a "0" or a "1" to the media. For example, a common type of defect is known as an amplitude dropout, in which the signal portion of the read-back signal is attenuated over the length of the defect. As such, the PDF of the samples read inside the defect is different than the PDF assumed (since it is not known that a defect exists). FIG. 6 shows an example of probability density functions inside a defect and outside a defect. In this example, probability density functions 602 and 604 correspond to written values −1 and +1, respectively, outside a defect. Probability density functions 606 and 608 correspond to written values −1 and +1, respectively, inside a defect. Since it is not known that a defect exists, PDFs 602 and 604 are used to produce soft-information and, therefore, there is a mismatch between the true PDFs and the assumed PDFs over the duration of a defect.

As shown, if a −1 is written, outside a defect the probability of reading a +3 is extremely small. Thus, if a +3 was read-back, the LLR produced for this sample would indicate this (i.e., would be a large negative value). Inside of a defect, however, the probability of reading a +3 is much greater. Thus, we have produced incorrect soft-information because the channel statistics do not match the assumed statistics. It is difficult for a decoder which utilizes soft-information to correct bits which have incorrect, large magnitude, soft-information (i.e., strongly indicate that an event is correct when, in fact, it is incorrect).

Figure 7:
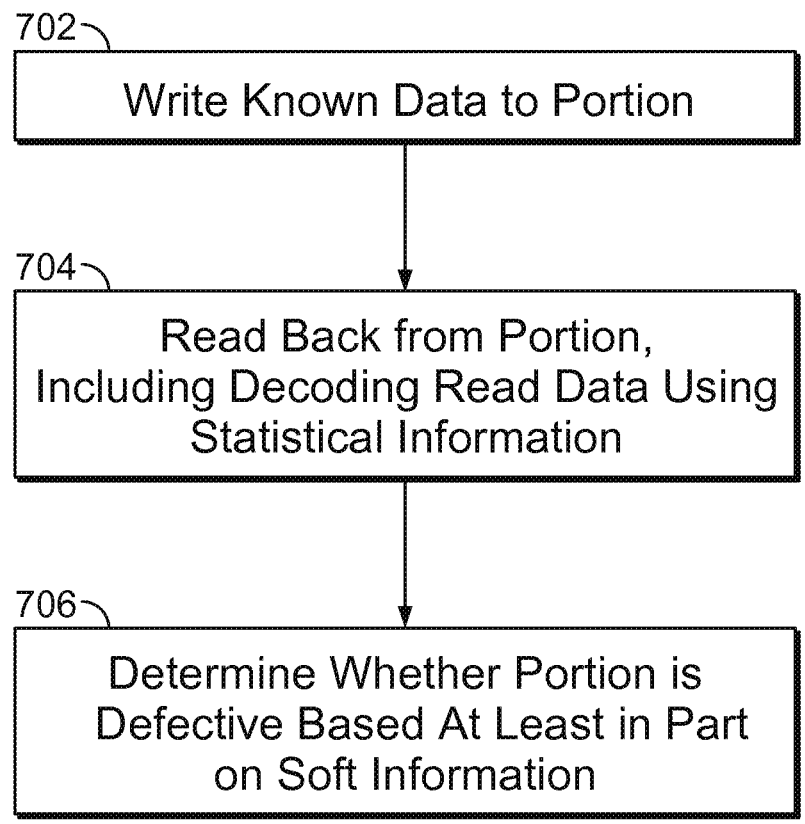
FIG. 7 is a flow chart illustrating an embodiment of a process for determining whether a portion of a storage device is defective.

FIG. 7 is a flow chart illustrating an embodiment of a process for determining whether a portion of a storage device is defective. In the case of an HDD, that portion may be a sector of a HDD.

In some embodiments, the technique described herein provides a figure-of-merit which may be used to margin HDDs for the presence of defects. The proposed figure-of-merit focuses on the operation of decoders that utilize statistical or soft-information as input, which have great difficulty in correcting bits for which the soft-information provided is incorrect and large in magnitude (i.e., falsely indicating that the information is correct with high probability). In addition to effectively identifying portions of the disk which are difficult for these decoders to recover data from, this technique also has the added benefit of having a low probability of false-detection (i.e., identifying a sector as defective when, in fact, it is not).

To describe the technique conceptually: decoders that utilize soft-information as input have great difficulty correcting bits which have large-magnitude, incorrect, LLRs. In the event that there is no defect present, the channel statistics should closely match the assumed statistics and, therefore, such an event should occur with low probability. In the event that there is a defect present, the channel statistics do not match the assumed statistics and, therefore, such an event can occur with greater probability. Thus, if this event occurs at least a certain number of times in a sector, it is highly probable that the sector contains a defect. This figure-of-merit both specifies the presence of a defect as well as indicates how difficult it is for a soft-input decoder to correctly decode the sector.

At 702, known data is written to a portion of the data storage device. In the case of a HDD, the portion may be a sector. In some embodiments, this process is run during a defect scan test, in which case a known data pattern is written at 702. In some embodiments, this process is run in the field, in which case a recovered data pattern is obtained at 702, as more fully described below. As used herein, known data refers to actual known data or assumed known data, such as recovered decoded data.

At 704, the data is read back from the disk. In some embodiments, the read-back waveform is applied to a detector which produces statistical information associated with the decision. For example, the statistical information may comprise log-likelihood ratios associated with each written bit. For example, following the convention used above, a positive LLR indicates that a given bit has greater probability of a −1 being written, whereas a negative LLR indicates that a given bit has a greater probability of a +1 being written (a zero LLR indicates that a −1 and a +1 are equally probable). In various embodiments, the LLR may be defined in a variety of ways.

At 706, it is determined whether the portion is defective based at least in part on the soft information, as more fully described below.

Figure 8:
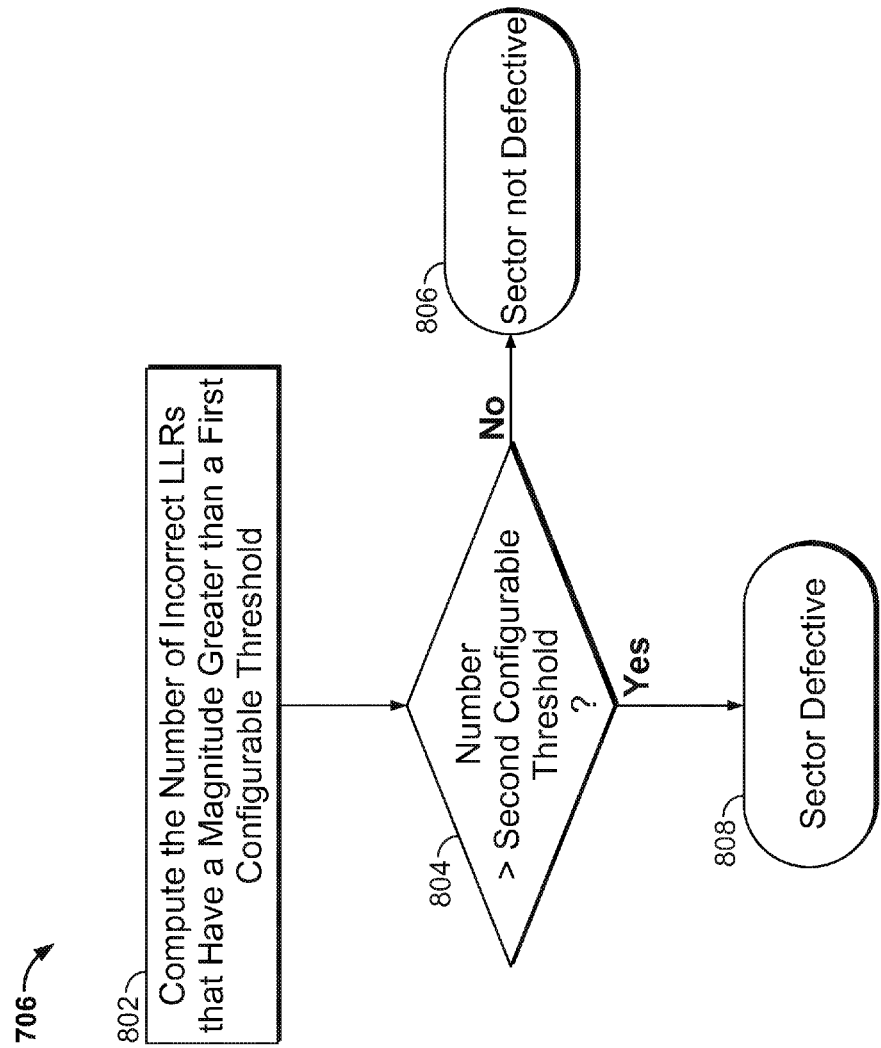
FIG. 8 is a flow chart illustrating an embodiment of a process for determining whether a portion of a data storage media is defective.

FIG. 8 is a flow chart illustrating an embodiment of a process for determining whether a portion of a data storage media is defective. In some embodiments, this process is used to perform 706 for the case where the statistical information is LLRs.

At 802, the number of incorrect LLRs that have a magnitude greater than a first configurable threshold is determined. First, the number of incorrect LLRs is described. This is a 1 bit symbol example (i.e., a symbol is either + or −1), but in other embodiments, longer symbols may be used, as more fully described below.

Since the written data is known, the number of incorrect LLRs is the sum of the number of times the known bit is +1 but the LLR indicates otherwise (LLR>0) and the number of times the known bit is −1 but the LLR indicates otherwise (LLR<0). In other words:

$$N_i = \sum_{k=0}^{n-1}(LLR_k > 0 \ \& \ d_k = +1) + \sum_{k=0}^{n-1}(LLR_k < 0 \ \& \ d_k = -1), \quad (5)$$

where $d_k$ is the known written data bit and n is the number of bits in a sector. In some embodiments, only bits with larger magnitude, incorrect LLRs are of interest. We denote the number of such bits as $N_i^{(\alpha_1)}$, which is given as, $$N_i^{(\alpha_1)} = \sum_{k=0}^{n-1}(LLR_k > \alpha_1 \ \& \ d_k = +1) + \sum_{k=0}^{n-1}(LLR_k < -\alpha_1 \ \& \ d_k = -1), \quad (6)$$

where $\alpha_1$ is a first (non-negative) configurable threshold. When $\alpha_1=0$, Equation 6 reduces to Equation 5.

At 804, it is determined whether the number of incorrect LLRs with a magnitude greater than a first configurable threshold is greater than a second configurable threshold. If the number of incorrect LLRs with a magnitude greater than a first configurable threshold is greater than a second configurable threshold, then the sector is considered defective at 808. If the number of incorrect LLRs with a magnitude greater than a first configurable threshold is not greater than a second configurable threshold, then the sector is not considered defective at 806.

In some embodiments, the figure-of-merit as to whether a sector should be considered defective is Defective=$(N_i^{(\alpha_1)} > \alpha_2)$, (7)

where $\alpha_2$ is a second configurable threshold. In one example, $\alpha_2=100$. In various embodiments, $\alpha_1$ and/or $\alpha_2$ may be tuned for good yield and performance. In various embodiments, $\alpha_1$ and/or $\alpha_2$ is/are selected based at least in part on sector length (n) and/or code rate. For example, if using a lower rate code (which can correct more errors), there is more tolerance, so $\alpha_2$ could be larger than when using a higher rate code.

The value of $N_i^{(\alpha_1)}$ should be small relative to the number of bits in a sector (i.e., the probability of such an occurrence is, by definition, small and, therefore, it is unlikely that such an occurrence happens many times in a sector). If the value of $N_i^{(\alpha_1)}$ is large (or greater than a second configurable threshold $\alpha_2$), then with high probability, the assumed statistics do not match the channel statistics. Thus, the sector should be marked as defective since a soft-input decoder will likely fail to decode this sector.

Other factors that go into selecting $\alpha_1$ and/or $\alpha_2$ could include: a target manufacturing yield, a target manufacturing failure parts per million (FPPPM) value, and/or a target margin, e.g., reserved for field-grown defects.

Although 1-bit symbols are described in the examples herein, in various embodiments, these techniques may be applied to symbols having any number of bits.

For symbols containing more than 1 bit, the LLRs are no longer scalar values, they are vectors. For the single bit example, the probability that a bit takes on 0 or 1 can be written as the following 2-element vector, $$P=(\Pr(x=0),\Pr(x=1)).$$

Without loss of information, we can scale these values by any constant, so we choose to divide by $\Pr(x=1)$, which gives, $$P/\Pr(x=1)=(\Pr(x=0)/\Pr(x=1),1).$$

The "1" provides no information, so we only need 1 element here (i.e., the LLR is a scalar). Taking the log of $\Pr(x=0)/\Pr(x=1)$ gives the LLR.

As an example, consider the 2-bit symbol case, which takes on 1 of 4 possible values $x=\{s0,s1,s2,s3\}$. Again, we write the probability vector as, $$P=(\Pr(x=s0),\Pr(x=s1),\Pr(x=s2),\Pr(x=s3))$$

which can be divided (as above), by $\Pr(x=s3)$ to give:

$$P/\Pr(x=s3)=(\Pr(x=s0)/\Pr(x=s3),\Pr(x=s1)/\Pr(x=s3),\Pr(x=s2)/\Pr(x=s3),1)$$

Note that although we have chosen element s3 arbitrarily, any element will do.

Since we assume that we know the transmitted symbol, we should expect that its probability (as computed by a detector) should be high. If it is the highest, then the symbol is not in error, and if it is not the highest the symbol is in error. As in the binary case, we are not just looking for errors here, we are looking for large errors (i.e., probabilities that indicate that any symbol other than that which was written is much more likely than the transmitted symbol). Therefore, define:

$st_k$=transmitted (written) symbol at location k.

$sx_k$=symbol with highest probability at location k, provided $sx_k$ is not $st_k$. Note that in the case that $st_k$ has the highest probability, $sx_k$ is chosen as the symbol with second highest probability.

We then define our LLR at position k ($LLR_k$) as, $$LLR_k=\text{Log}(\Pr(x_k=sx_k)/\Pr(x_k=st_k))$$

Note, if $LLR_k$ is positive, that means $sx_k$ is the most likely symbol (i.e., an error has occurred), and if $LLR_k$ is negative, then $st_k$ is the most likely symbol (i.e., no error has occurred). Thus, for multi-bit symbols, equation (6) is written as, $$N_i=\Sigma_{k=0}^{n-1}(LLR_k>\alpha_1) \qquad (8)$$

where setting $\alpha_1=0$ gets back to equation (5).

Figure 9:
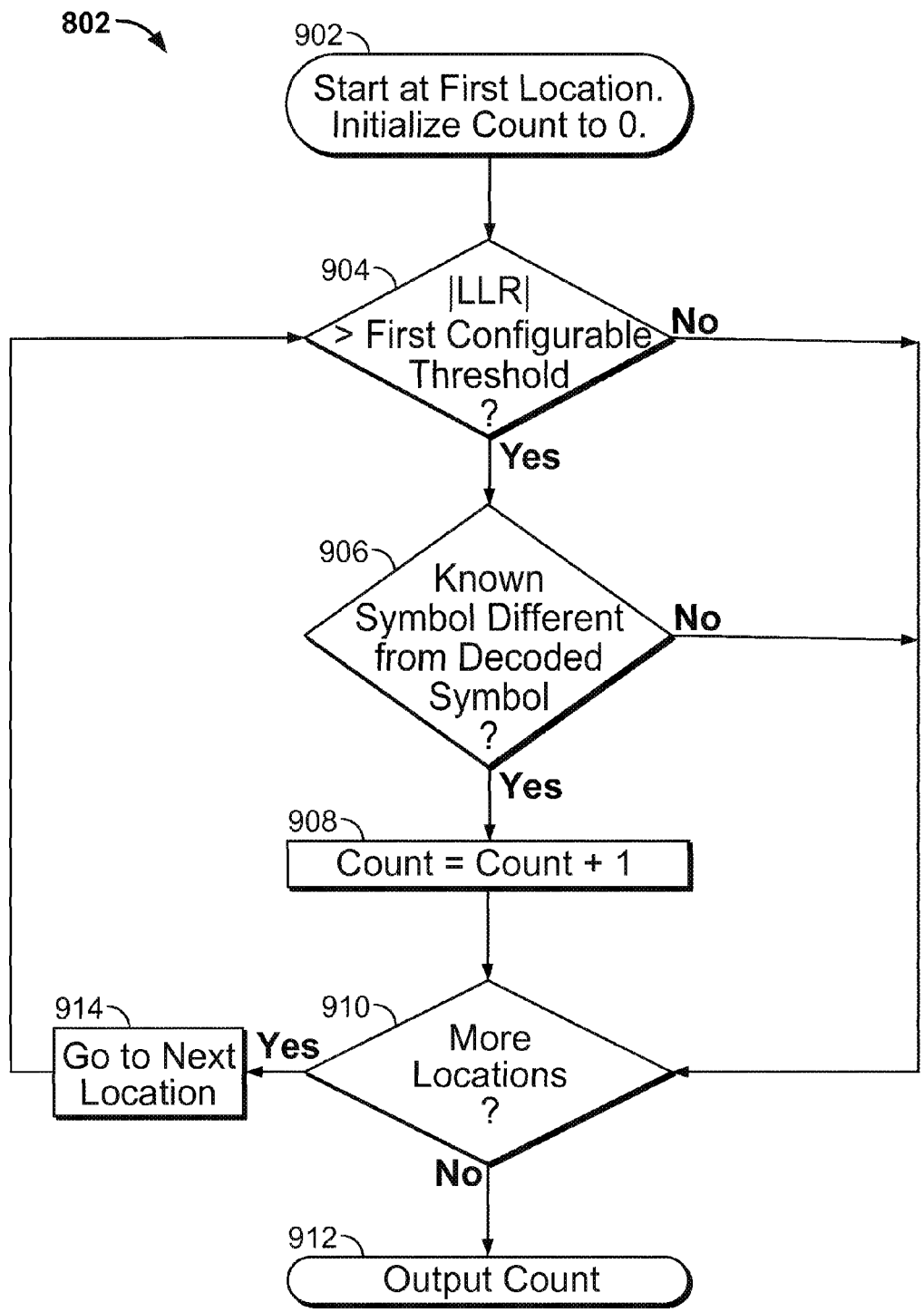
FIG. 9 is a flow chart illustrating an embodiment of a process for computing the number of incorrect LLRs with magnitudes that are greater than a first configurable threshold.

FIG. 9 is a flow chart illustrating an embodiment of a process for computing the number of incorrect LLRs with magnitudes that are greater than a first configurable threshold. In some embodiments, this process is used to perform 802. In some embodiments, this process is used to compute at least a portion of equation(s) 5, 6, and/or 8.

At 902, start at a first location, such as k=0. A variable count is initialized to 0.

At 904, it is determined if the magnitude of the LLR at location k is greater than a first configurable threshold $\alpha_1$. If it is, then at 906, it is determined if the symbol known to be written at location k is different from the decoded symbol, in which case, the decoded symbol is in error. If it is, then the decoded symbol is in error by greater than a threshold $\alpha_1$ and therefore, at 908, count is increased by 1. At 910, if there are more locations (i.e., k<n−1) in the sector (or other portion of the media being scanned), then at 914, go to the next location (i.e., k=k+1), and then return to 904. At 910, if there are no more locations (i.e., k=n−1), then count is output at 912. At 912, count is equal to the number of incorrect LLRs with magnitudes that are greater than $\alpha_1$.

At 904, if it is determined that the magnitude of the LLR at location k is not greater than $\alpha_1$, then the process goes to 910. Likewise, at 906, if it is determined that the known written symbol is not different from the decoded symbol, then the process goes to 910.

In various embodiments, the techniques described herein can be performed during manufacturing (e.g., defect scan) and/or in the field. A defect scan yields a "p list", which is a primary list of defects detected during manufacturing. Once the media is in operation in the field, a "g list" is maintained, which is a grown list of defects. Any defects that develop or "grow" over the life of the media are added to the g list.

In some embodiments, defects that develop in the field are detected using this process. During normal operation in the field, instead of using known written data, recovered decoded data (after a recovery process) is used. Decoded data after a recovery process can be assumed to be the known written data since the point of the recovery process is to recover the actual written data. Every time (or at some regular interval, e.g., every x reads) a sector is read back, the above figure-of-merit may be computed (using the decoded data after a recovery process) to determine how close the sector is to failure. If the sector is deemed defective, its location can be marked as defective (e.g., added to a g list) and the sector can be moved to another location. At 906, it would be determined if the recovered decoded symbol is different from the decoded symbol during normal operation. The count can then be compared with $\alpha_2$ to determine if the drive has failed. Thus, as used herein, known data refers to actual known data or assumed known data, such as recovered decoded data.

Figure 10:
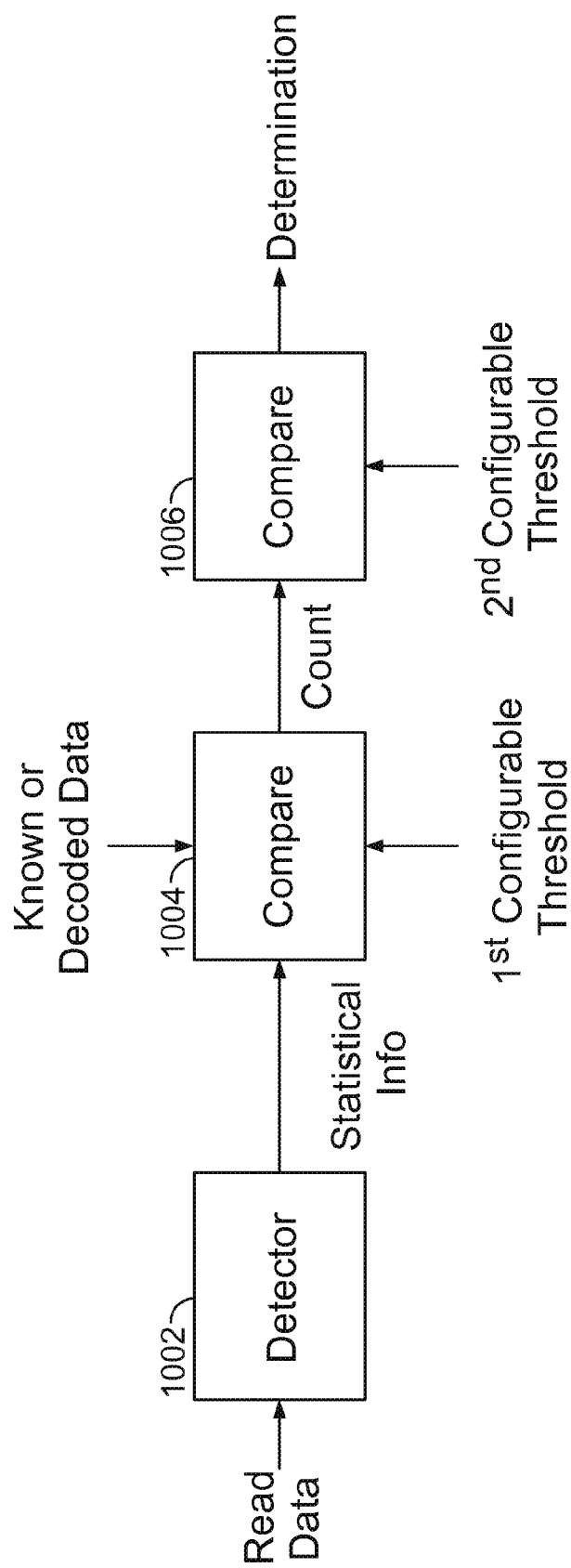
FIG. 10 is a block diagram illustrating an embodiment of a system for margining of magnetic recording systems.

FIG. 10 is a block diagram illustrating an embodiment of a system for margining of magnetic recording systems. In some embodiments, this system is associated with decoding architectures that utilize soft-information.

In this example, system 1000 is shown to include: detector 1002, compare block 1004, and compare block 1006. In various embodiments, detector 1002 is used to perform 704, compare block 1004 is used to perform 802 and/or 902-912, and compare block 1006 is used to perform 804-808. Detector 1002 takes read data as input and outputs detected data and statistical information (e.g., LLRs). Compare block 1004 takes the known data (or recovered decoded data, e.g., after a data recovery process, when using this technique in the field), the statistical information, and a first configurable threshold $\alpha_1$ as input. Compare block 1004 outputs a count value, which is the number of incorrect LLRs with a magnitude greater than $\alpha_1$. Compare block 1006 takes the count and second configurable threshold $\alpha_2$ and outputs a determination of whether the sector is defective.

In some embodiments, system 100 is included on a chip(s), where the chip outputs one or more parameters, such as the figure of merit and/or a determination of whether the sector is defective. Inputs to the chip could include the first configurable threshold $\alpha_1$ and/or the second configurable threshold $\alpha_2$. For example, the first configurable threshold $\alpha_1$ could have a preconfigured value and second configurable threshold $\alpha_2$ could be set by the user. The chip will produce the number of LLRS that violate the threshold $\alpha_1$ for each sector, which can be compared with $\alpha_2$. In this way, the customer can decide the acceptable number of such violations. In this way, the user can decide the acceptable number of such violations.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
 a first comparator configured to:
  obtain known data associated with a portion of a storage device;
  obtain (1) a set of one or more estimated values associated with the portion and (2) a set of one or more reliabilities, wherein each reliability in the set of reliabilities corresponds to an estimated value in the set of estimated values;
  obtain a first configurable threshold;
  determine which of the set of estimated values are incorrect based at least in part on the set of estimated values and the known data; and
  determine a number of incorrect estimated values that have a corresponding reliability that is greater than the first configurable threshold; and
 a second comparator configured to:
  obtain a second configurable threshold, wherein the second configurable threshold is set to a larger value for a first code that is capable of correcting more errors than for a second code that is capable of correcting fewer codes; and
  compare the number of incorrect estimated values that have a corresponding reliability that is greater than the first configurable threshold against a second configurable threshold.

2. The system of claim 1, wherein the storage device includes a hard disk drive.

3. The system as recited in claim 1, wherein the second comparator is further configured to: determine whether the portion is defective, including by:
 in the event the number of incorrect estimated values that have a corresponding reliability that is greater than the first configurable threshold is less than or equal to the second configurable threshold, determining that the portion is not defective; and
 in the event the number of incorrect estimated values that have a corresponding reliability that is greater than the first configurable threshold is greater than the second configurable threshold, determining that the portion is defective.

4. The system as recited in claim 3, wherein:
 determining whether the portion is defective is performed during manufacturing testing; and
 the second comparator is further configured to: in the event the number of incorrect estimated values that have a corresponding reliability that is greater than the first configurable threshold is greater than the second configurable threshold, add the defective portion to list of defects detected during manufacturing testing.

5. The system as recited in claim 3, wherein:
 determining whether the portion is defective is performed during field operation; and
 the second comparator is further configured to: in the event the number of incorrect estimated values that have a corresponding reliability that is greater than the first configurable threshold is greater than the second configurable threshold, move data to a different location.

6. A method, comprising:
 obtaining known data associated with a portion of a storage device;
 obtaining (1) a set of one or more estimated values associated with the portion and (2) a set of one or more reliabilities, wherein each reliability in the set of reliabilities corresponds to an estimated value in the set of estimated values;
 obtaining a first configurable threshold;
 obtaining a second configurable threshold, wherein the second configurable threshold is set to a larger value for a first code that is capable of correcting more errors than for a second code that is capable of correcting fewer codes;
 determining which of the set of estimated values are incorrect based at least in part on the set of estimated values and the known data;
 using a processor to determine a number of incorrect estimated values that have a corresponding reliability that is greater than the first configurable threshold; and
 comparing the number of incorrect estimated values that have a corresponding reliability that is greater than the first configurable threshold against a second configurable threshold.

7. The method as recited in claim 6, wherein the storage device includes a hard disk drive.

8. The method as recited in claim 6 further comprising: determining whether the portion is defective, including by:
 in the event the number of incorrect estimated values that have a corresponding reliability that is greater than the first configurable threshold is less than or equal to the second configurable threshold, determining that the portion is not defective; and
 in the event the number of incorrect estimated values that have a corresponding reliability that is greater than the first configurable threshold is greater than the second configurable threshold, determining that the portion is defective.

9. The method as recited in claim 8, wherein:
 determining whether the portion is defective is performed during manufacturing testing; and
 the method further includes: in the event the number of incorrect estimated values that have a corresponding reliability that is greater than the first configurable threshold is greater than the second configurable threshold, adding the defective portion to list of defects detected during manufacturing testing.

10. The method as recited in claim 8, wherein:
 determining whether the portion is defective is performed during field operation; and
 the method further includes: in the event the number of incorrect estimated values that have a corresponding reliability that is greater than the first configurable threshold is greater than the second configurable threshold, moving data to a different location.

11. A computer program product for processing a portion of a storage device, the computer program product being embodied in a non-transitory computer readable storage medium and comprising computer instructions for:
 obtaining known data associated with a portion of a storage device;

obtaining (1) a set of one or more estimated values associated with the portion and (2) a set of one or more reliabilities, wherein each reliability in the set of reliabilities corresponds to an estimated value in the set of estimated values;

obtaining a first configurable threshold;

obtaining a second configurable threshold, wherein the second configurable threshold is set to a larger value for a first code that is capable of correcting more errors than for a second code that is capable of correcting fewer codes;

determining which of the set of estimated values are incorrect based at least in part on the set of estimated values and the known data;

determining a number of incorrect estimated values that have a corresponding reliability that is greater than the first configurable threshold; and comparing the number of incorrect estimated values that have a corresponding reliability that is greater than the first configurable threshold against a second configurable threshold.

12. The computer program product as recited in claim 11, wherein the storage device includes a hard disk drive.

13. The computer program product as recited in claim 11 further comprising computer instructions for: determining whether the portion is defective, including computer instructions for:

in the event the number of incorrect estimated values that have a corresponding reliability that is greater than the first configurable threshold is less than or equal to the second configurable threshold, determining that the portion is not defective; and in the event the number of incorrect estimated values that have a corresponding reliability that is greater than the first configurable threshold is greater than the second configurable threshold, determining that the portion is defective.

14. The computer program as recited in claim 13, wherein:

determining whether the portion is defective is performed during manufacturing testing; and the computer program further includes computer instructions for: in the event the number of incorrect estimated values that have a corresponding reliability that is greater than the first configurable threshold is greater than the second configurable threshold, adding the defective portion to list of defects detected during manufacturing testing.

15. The computer program as recited in claim 13, wherein:

determining whether the portion is defective is performed during field operation; and the computer program further includes computer instructions for: in the event the number of incorrect estimated values that have a corresponding reliability that is greater than the first configurable threshold is greater than the second configurable threshold, moving data to a different location.

\* \* \* \* \*